US010231320B2

(12) United States Patent
Sato

(10) Patent No.: US 10,231,320 B2
(45) Date of Patent: Mar. 12, 2019

(54) PROCESSING MACHINE INCLUDING ELECTRIC DISCHARGER

(71) Applicant: FANUC CORPORATION, Minamitsuru-gun, Yamanashi (JP)

(72) Inventor: Naoki Sato, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 307 days.

(21) Appl. No.: 15/202,804

(22) Filed: Jul. 6, 2016

(65) Prior Publication Data

US 2017/0013700 A1 Jan. 12, 2017

(30) Foreign Application Priority Data

Jul. 10, 2015 (JP) ................................ 2015-138467

(51) Int. Cl.

*H05F 3/04* (2006.01)
*H01L 21/67* (2006.01)
*H05F 3/06* (2006.01)
*H05F 3/00* (2006.01)

(52) U.S. Cl.

CPC ..................................... *H05F 3/00* (2013.01)

(58) Field of Classification Search

CPC ..... H05F 3/00; H05F 3/04; H05F 3/06; H01L 21/67005; H01L 21/67253
USPC ........................................................ 361/212
See application file for complete search history.

(56) References Cited

U.S. PATENT DOCUMENTS 5,667,565 A 9/1997 Gondar

FOREIGN PATENT DOCUMENTS

| | | | |
|---|---|---|---|
| CN | 1851893 | A | * 10/2006 |
| JP | 6120247 | U | 2/1986 |
| JP | S61071901 | A | 4/1986 |
| JP | 06297292 | A | 10/1994 |
| JP | H07108435 | A | 4/1995 |
| JP | H07237185 | A | 9/1995 |
| JP | 10118884 | A | 5/1998 |
| JP | 2000-340925 | A | 12/2000 |
| JP | 2003103401 | A | 4/2003 |
| JP | 2004-219572 | A | 8/2004 |
| JP | 2004-291200 | A | 10/2004 |
| JP | 2006281459 | A | 10/2006 |
| JP | 2007144583 | A | 6/2007 |
| JP | 2007210096 | A | 8/2007 |
| JP | 4393780 | B2 | 1/2010 |

(Continued)

OTHER PUBLICATIONS

Machine Translation of Chen et al. Chinese Patent Document CN 1851893 A.*

(Continued)

*Primary Examiner* — Kevin J Comber
(74) *Attorney, Agent, or Firm* — RatnerPrestia

(57) ABSTRACT

In a processing machine according to the present invention, an electric discharger to remove static electricity from a charged work piece or charged machining chips is installed on a movement means including a beam supported by a constituting member of the processing machine and a power source installed in the beam. By making the electric discharger movable inside and outside the processing machine, the static electricity can be removed from machining chips and the like in a plurality of areas needing removal of the static electricity using a small number of the electric dischargers.

4 Claims, 8 Drawing Sheets

(56) References Cited

FOREIGN PATENT DOCUMENTS

| | | | |
|---|---|---|---|
| JP | 2012174795 | A | 9/2012 |
| JP | 2013136113 | A | 7/2013 |
| JP | 2013146651 | A | 8/2013 |
| JP | 2015020260 | A | 2/2015 |
| JP | 2015024454 | A | 2/2015 |
| WO | 2008075571 | A1 | 6/2008 |

OTHER PUBLICATIONS

Machine Translation of Maeda et al. Japanese Patent Document JP S61-071901 A.*

Machine Translation of Matsumura et al. Japanese Patent Document JP H06-297292 A.*

Machine Translation of Kumamoto et al. Japanese Patent Document JP H07-108435 A.*

Notification of Reasons for Refusal for Japanese Application No. 2015-138467, dated Sep. 22, 2017, including English translation, 10 pages.

Notification of Reasons for Refusal for Japanese Application No. 2015-138467, dated Apr. 17, 2018 with translation, 7 pages.

* cited by examiner

PROCESSING MACHINE INCLUDING ELECTRIC DISCHARGER

BACKGROUND OF THE INVENTION

1. Field of the Invention

The present invention relates to a processing machine including an electric discharger.

2. Description of the Related Art

Among work pieces to be processed by a processing machine, some work pieces themselves or machining chips produced by processing are charged or likely to be charged. In processing of such work pieces, machining chips may adhere to the inside or the outside of a processing machine due to an attraction force generated by the charging, which may mar the machine appearance. Also, various adverse effects such as prevention of monitoring inside the machine, damage to the machine, and abnormal processing quality may be caused by adhesion of machining chips.

Thus, conventionally, machining chips adhering inside or outside a processing machine have been cleaned up. As another method, as illustrated in FIG. 8, an electric discharger 13 that removes static electricity has been installed in an area where a large quantity of machining chips adheres or an important area inside or outside a processing machine 1 to reduce or prevent adhesion of machining chips. JP 2000-340925 A, JP 2004-219572 A, and Japanese Patent No. 4393780 disclose devices using an electric discharger in production processes.

However, machining chips need to be manually cleaned up. In addition, it is necessary to stop the machine during clean-up. Also, even if an electric discharger is installed in a specific area, the electric discharger is fixed and the effect of electric discharge is limited. Thus, electric discharge is performed only around the installed area and adhesion of machining chips is not eliminated in areas where the effect does not show up. Also, to remove static electricity in a wide range, as illustrated in FIG. 9, a plurality of the electric dischargers 13 may be needed inside or outside the processing machine 1.

SUMMARY OF THE INVENTION

In view of the above, an object of the present invention is to provide a processing machine including a small number of electric dischargers capable of removing static electricity efficiently in a wide range using the electric dischargers.

The present invention solves the above problems by movably installing an electric discharger to remove static electricity from a charged work piece or charged machining chips.

Then, a processing machine according to the present invention includes an electric discharger to remove static electricity from a charged work piece or charged machining chips and a movement means that moves the electric discharger.

The processing machine includes an imaging device that captures a state of the charged work piece or the charged machining chips and a determination means that determines a location needing removal of the static electricity from information captured by the imaging device may further be included, wherein the electric discharger may be moved to the location determined to need the removal of the static electricity by the determination means.

The imaging device may be mounted on the movement means.

The movement means may be a robot.

The movement means may include a beam supported by a constituting member of the processing machine and a power source provided in the beam.

According to the present invention, static electricity can be removed efficiently in a wide range using a small number of electric dischargers. Also, by using the processing machine in combination with an imaging device, static electricity can be removed reliably and efficiently.

BRIEF DESCRIPTION OF THE DRAWINGS

The above object and other objects of the present invention will be apparent from the description below with reference to appended drawings. Among these drawings.

DETAILED DESCRIPTION OF THE PREFERRED EMBODIMENTS

The present application is an application claiming priority from Japanese Patent Application No. 2015-138467, filed on Jul. 10, 2015 in Japan. The contents of the Japanese Patent Application are incorporated into the contents of the present application by reference thereto.

Hereinafter, embodiments of the present invention will be described together with the drawings. The same reference signs are used for the configurations same as or similar to those of conventional technology.

An embodiment of the present invention will be described. A processing machine according to the present embodiment has an electric discharger, which is fixed in the conventional technology, installed movably. By moving the discharger to an area where static electricity needs to be removed, machining chips in a wide range can be removed by a small number of electric dischargers. Incidentally, processing machines in the present invention include machine tools, industrial machines, and 3D printers.

Figure 1:
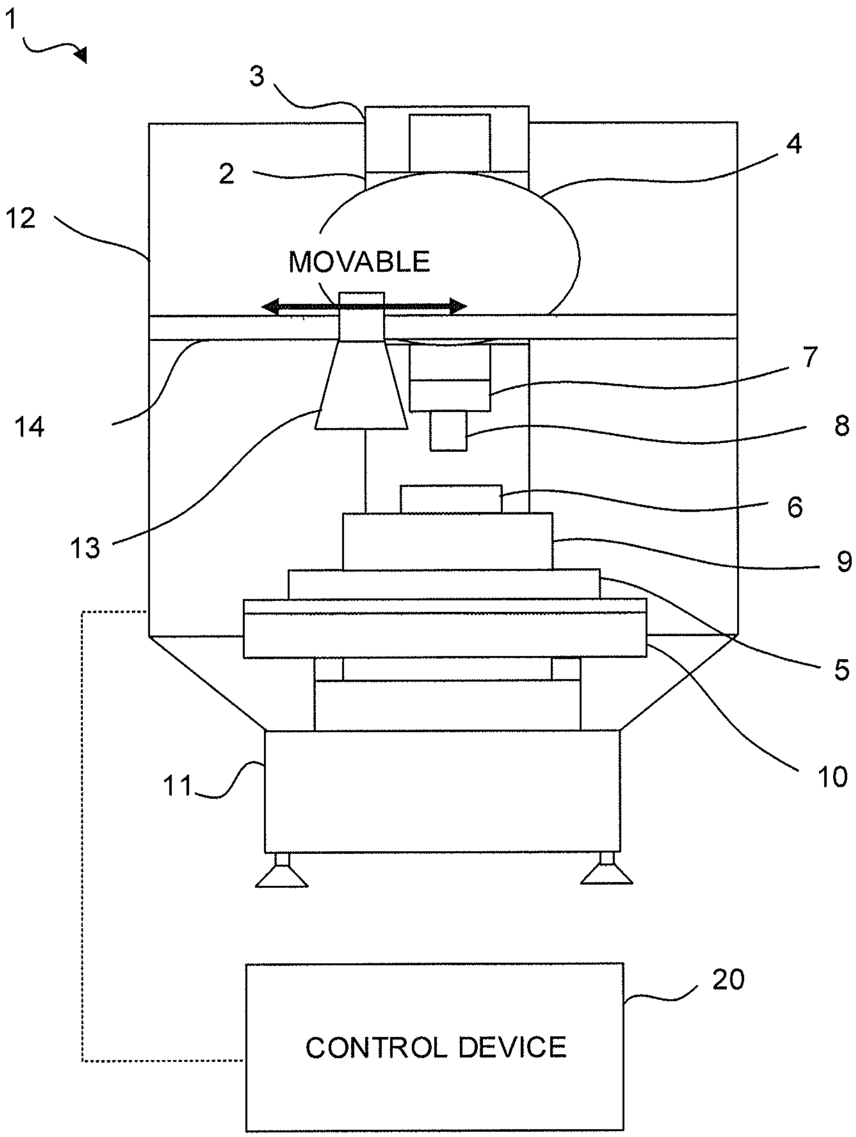
FIG. 1 is a diagram of a processing machine including an electric discharger according to an embodiment of the present invention.

FIG. 1 illustrates a schematic diagram of a processing machine including an electric discharger according to the present embodiment. A processing machine 1 according to the present embodiment includes a bed 11 and a column 3 in a columnar shape installed upright from an upper portion on the rear side of the bed 11. The column 3 includes a spindle head 2 in the upper portion on the front side thereof. A spindle 7 is mounted on the front side of the spindle head 2. Various tools 8 that can be replaced using a tool replacing device 4 are inserted into the spindle 7, which are able to rotate at various rotation speeds together with the spindle 7.

A saddle 10 is provided movably in two directions perpendicular to an axis of the spindle 7 and perpendicular to each other. A table 5 is supported by the saddle 10, and a work piece 6 is mounted on the table 5 by a jig 9. The tool 8 works on the work piece 6 by making various relative movements in accordance with the type of processing. The space of the tool 8 and a processed portion of the work piece 6 is surrounded by a fixed cover 12.

The above basic configuration is not different from that of a conventional processing machine. The present embodiment is characterized in that the electric discharger 13 is movably mounted on the processing machine 1.

The electric discharger 13 is a device that neutralizes charges of a charged object. There are many types of the electric discharger 13, such as the corona discharge type and the ionizing radiation type, and any type may be adopted to the electric discharger 13 in the present embodiment. In the present embodiment, the electric discharger 13 is installed on a movement means 14 mounted on the processing machine 1.

The movement means 14 includes a beam supported by a constituting member of the processing machine 1 and a power source (not illustrated) installed in the beam. The movement means 14 is actuated by operating the power source through a control device 20 automatically or by a manual operation via a control panel, so that the electric discharger 13 can be moved to an area where static electricity needs to be removed. Possible power sources include: a motor and a ball screw; a motor, a pulley, and a belt; a motor, a gear, and a chain; a hydraulic cylinder or air cylinder; or a motor, and an arm.

Figure 2A:
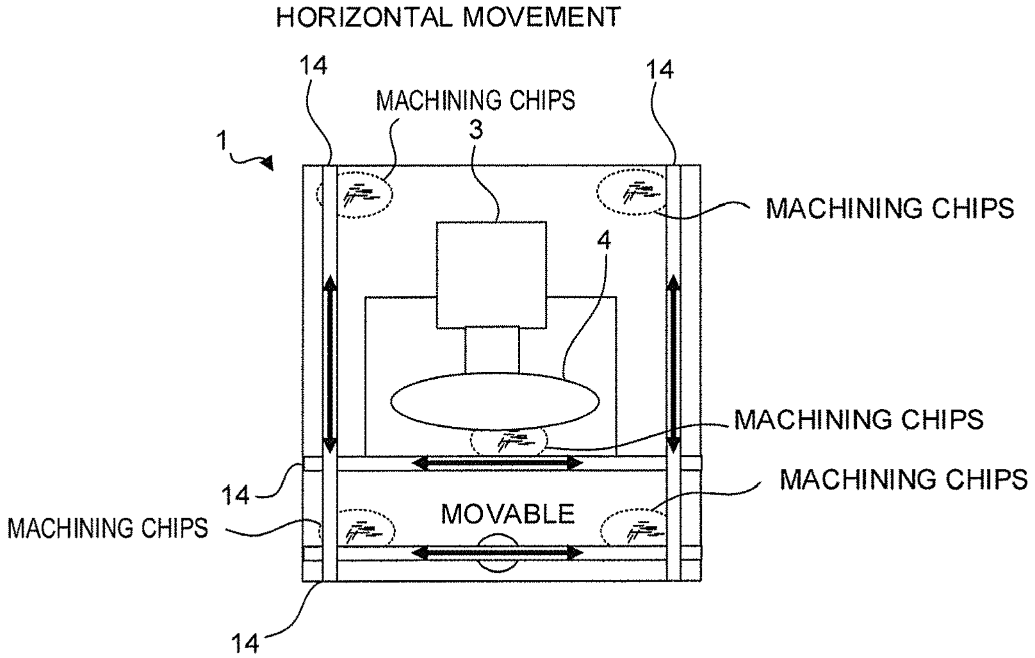
FIG. 2A is a diagram illustrating movement in a horizontal direction of the electric discharger according to an embodiment of the present invention.
Figure 2B:
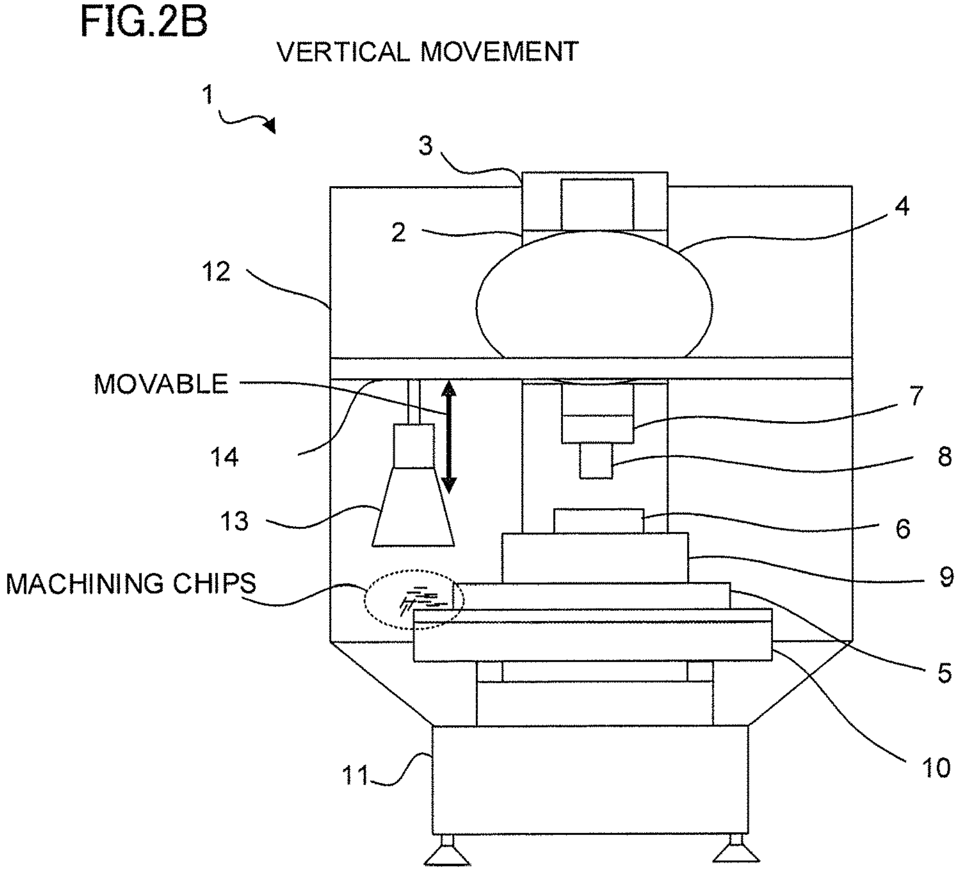
FIG. 2B is a diagram illustrating movement in a vertical direction of the electric discharger according to an embodiment of the present invention.

FIGS. 2A and 2B illustrate examples of arrangement of the movement means 14 in the processing machine 1. There is a plurality of areas inside the fixed cover 12 of the processing machine 1, where machining chips generated during processing are likely to be deposited/to adhere and positions thereof are diverse depending on the configuration of the processing machine 1 and the details of processing. FIG. 2A is a diagram when the processing machine is viewed from above. The electric discharger 13 therein is made movable in the horizontal direction by, for example, arranging the beams of the movement means 14 so as to cross each other. FIG. 2B is a diagram when the processing machine is viewed from the front. The electric discharger 13 therein is made movable in the vertical direction by providing an arm or the like in a drive unit of the movement means 14. The electric discharger 13 is made thereby movable three-dimensionally to a position where static electricity needs to be removed by the processing machine 1.

Incidentally, the movement means 14 may be installed in an appropriate position such that the electric discharger 13 can be moved to an area where static electricity is removed. For example, the movement means 14 may be installed so as to move, as illustrated in FIGS. 2A and 2B, inside the processing machine 1 or by extending over from the outside to the inside of the processing machine 1. In such a case, also the electric discharger 13 can be moved through the outside and the inside of the processing machine 1 (by passing through a door provided in the fixed cover or the like). A plurality of units of the electric discharger 13 or the movement means 14 may be provided and when, for example, static electricity outside the processing machine 1 needs to be removed, different units of the electric discharger 13 and the movement means 14 may be installed outside.

The electric discharger 13 that is installed may obstruct certain work such as replacement of the work piece 6 and maintenance of the processing machine 1. If the electric discharger 13 is movable as in the present embodiment, the electric discharger 13 can be moved to an area where it does not obstruct the work. In addition, the electric discharger 13 itself can be retreated to an area where machining chips do not adhere.

Figure 3:
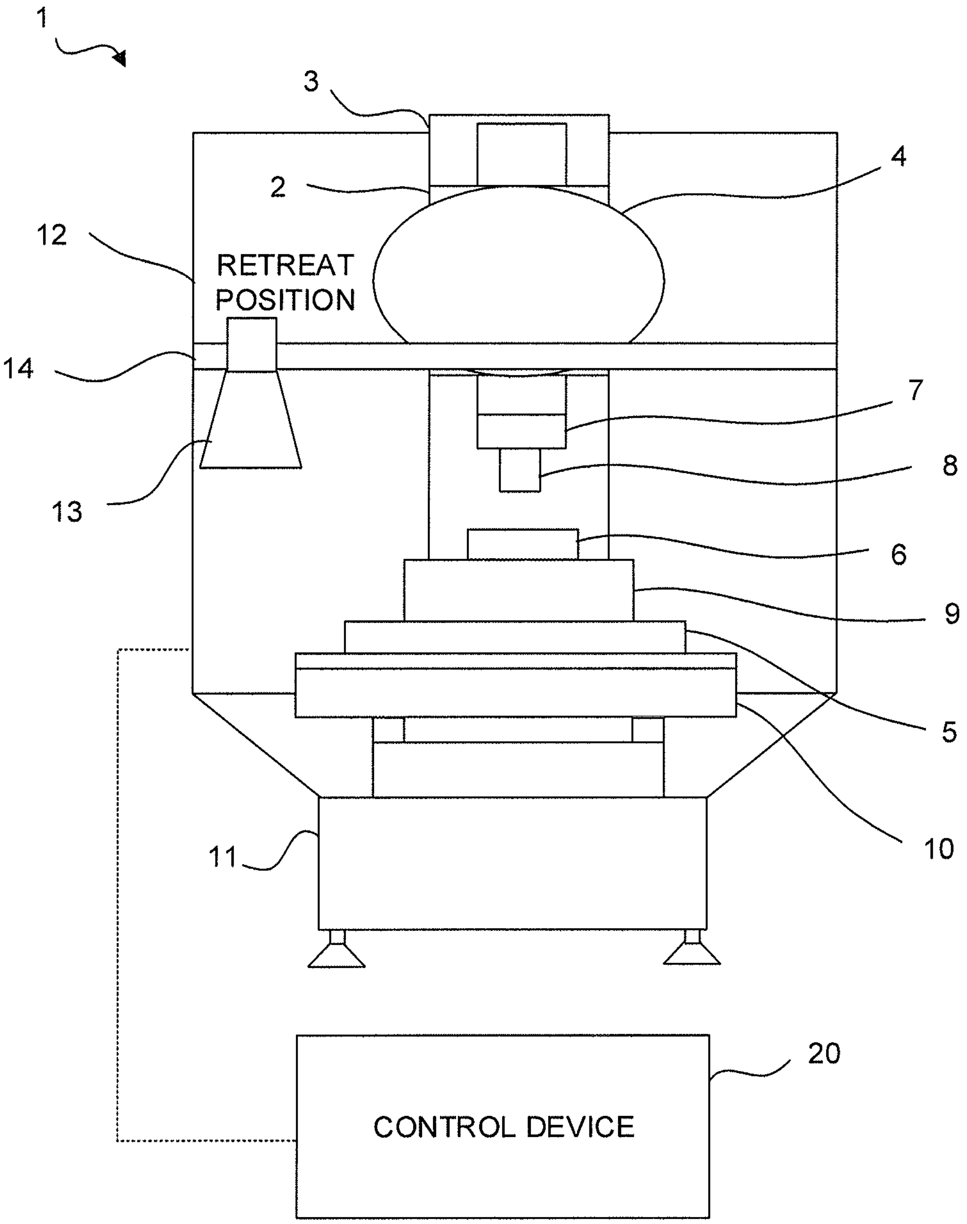
FIG. 3 is a diagram illustrating a retreat state of the electric discharger according to an embodiment of the present invention.

FIG. 3 is a diagram illustrating a state in which the electric discharger 13 is retreated to a retreat position in the processing machine 1 according to the present embodiment. By enabling the electric discharger 13 to retreat as illustrated in FIG. 3, the electric discharger 13 can be made not to interfere with, for example, a work piece when it is installed. Incidentally, the retreat position of the electric discharger 13 can be provided outside the processing machine 1 by installing the movement means 14 extending over from the outside to the inside of the processing machine 1.

With the configuration provided in the processing machine according to the present embodiment, static electricity can be removed efficiently in a wide range using a small number of electric dischargers.

The processing machine according to the present embodiment includes, in addition to a movable electric discharger, an imaging device and uses the movable electric discharger and the imaging device in combination. Accordingly, static electricity can selectively be removed by monitoring areas where a large quantity of machining chips adheres or important areas such as a jig fixing a work piece.

Figure 4:
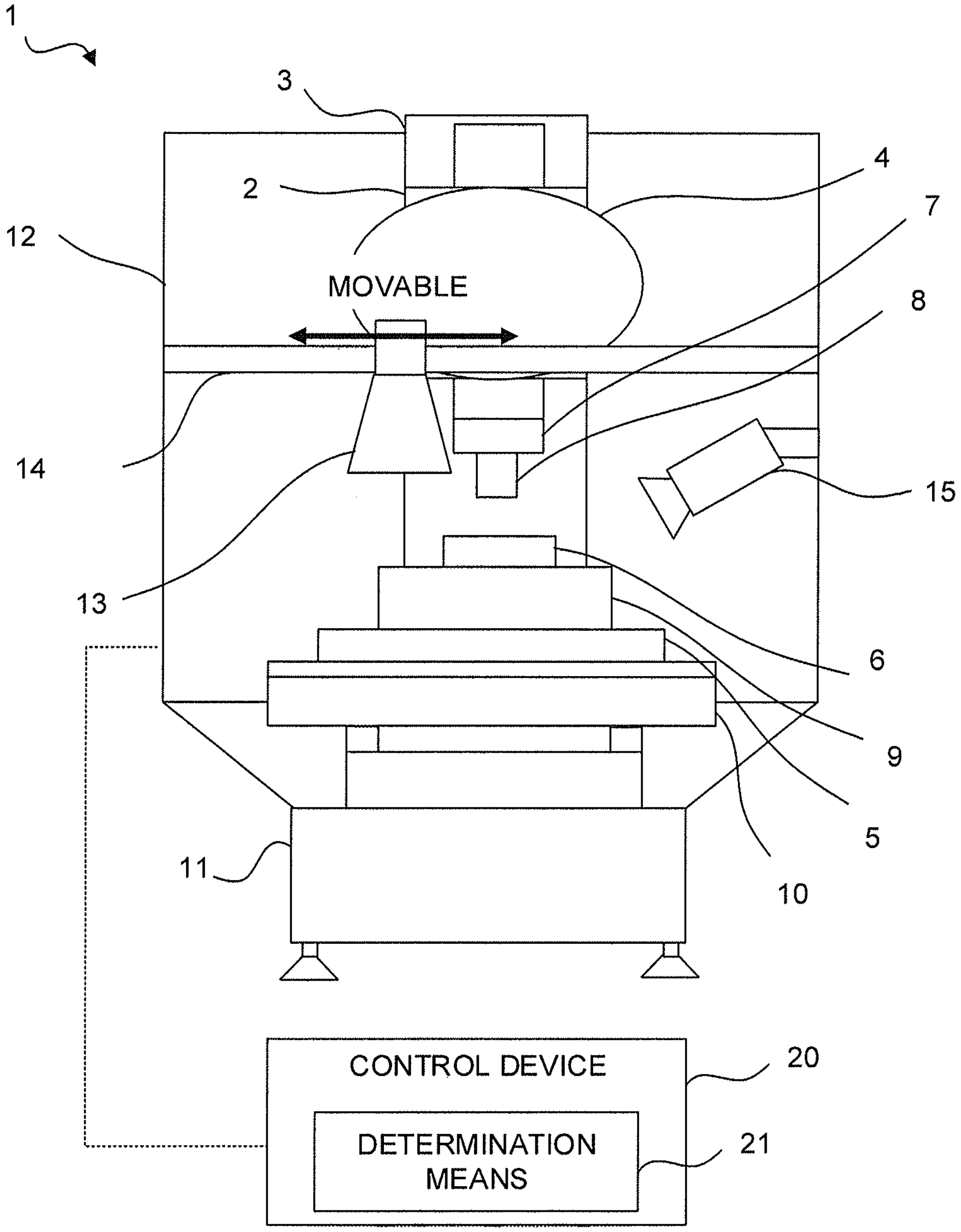
FIG. 4 is a diagram of a processing machine including an imaging device according to an embodiment of the present invention.

FIG. 4 illustrates a schematic diagram of the processing machine including the electric discharger according to the present embodiment. The processing machine 1 according to the present embodiment further includes an imaging device 15. The imaging device 15 may, as illustrated in FIG. 4, fixedly be provided in a position allowing the imaging device 15 to image areas where a large quantity of machining chips adheres or important areas such as a jig fixing a work piece. If there is a plurality of areas to be monitored, a plurality of units of the imaging device 15 may be installed. Further, the imaging device 15 may be installed outside the processing machine 1.

For example, an adhesion condition of machining chips may be determined by a determination means 21 of the control device 20 based on changes of the color or the like of an area captured by the imaging device 15. If it is determined that machining chips adhere, the control device 20 automatically moves the electric discharger 13 to an area captured by the imaging device 15 to remove static electricity. Also, another method of determination by the determination means 21 may be used, where a normal image in a state in which no machining chip adheres in an area captured by the imaging device 15 is stored in a memory of the control device 20 in advance, and an adhesion condition of machining chips is determined based on a difference image created by image processing of the normal image and an image captured by the imaging device 15. Further, an operator may verify an image captured by the imaging device 15 on a monitor so as to move the electric discharger 13 to an area for performing electric discharge, by manually operating a control panel or the like to remove static electricity.

Figure 5:
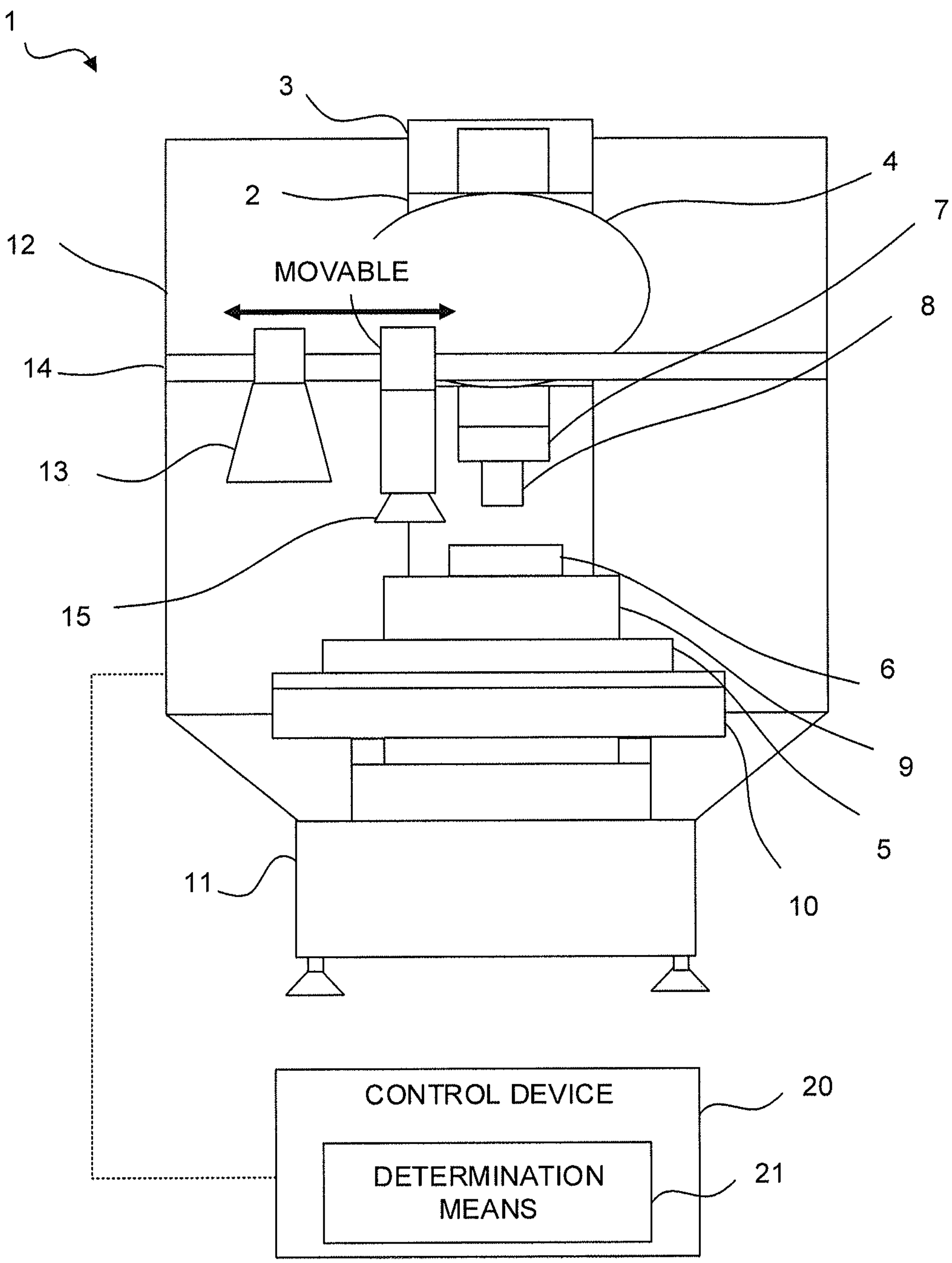
FIG. 5 is a diagram of the processing machine including a movable imaging device according to an embodiment of the present invention.

Incidentally, as illustrated in FIG. 5, the imaging device 15 may be made movable by installing the imaging device 15 on the movement means 14. In this manner, a wide range can be monitored by a small number of the imaging devices 15. The imaging device 15 may movably be installed on a movement means different from the movement means 14 on which the electric discharger 13 is installed. Further, the electric discharger 13 and the imaging device 15 can be configured to be movable three-dimensionally.

By combining the electric discharger and the imaging device in the configuration provided in a processing machine according to the present embodiment, static electricity can be removed reliably and efficiently.

A processing machine according to the present embodiment may adopt a robot as a movement means that enables an electric discharger to move.

Figure 6:
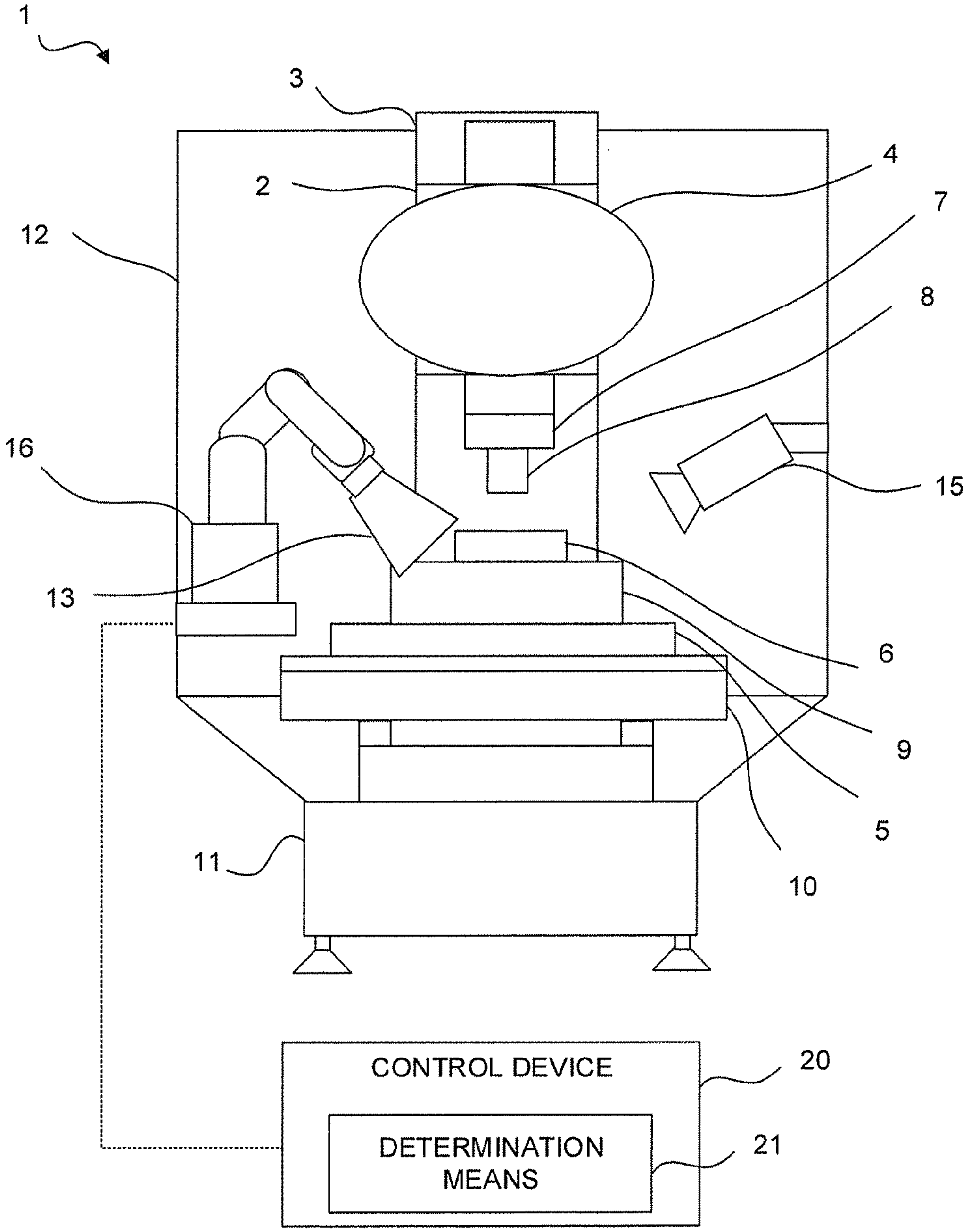
FIG. 6 is a diagram of the processing machine in which the electric discharger is moved by a robot, according to an embodiment of the present invention.

FIG. 6 illustrates a schematic diagram of the processing machine including the electric discharger according to the present embodiment. The processing machine 1 according to the present embodiment includes, instead of the movement means 14, a robot 16. The robot 16 is mounted with, as illustrated in FIG. 6, the electric discharger 13. The electric discharger 13 can be moved to an area of the processing machine 1 where electric discharge is needed by driving the robot 16. The determination means 21 of the control device 20 determines an area of the processing machine 1 where electric discharge is needed, based on images captured by the imaging device 15. The control device 20 controls the robot 16 based on a determination result thereof to cause the electric discharger 13 to be moved to an area where electric discharge is needed.

The robot 16, as a movement means, may be installed inside the processing machine 1 or outside the processing machine 1.

Figure 7:
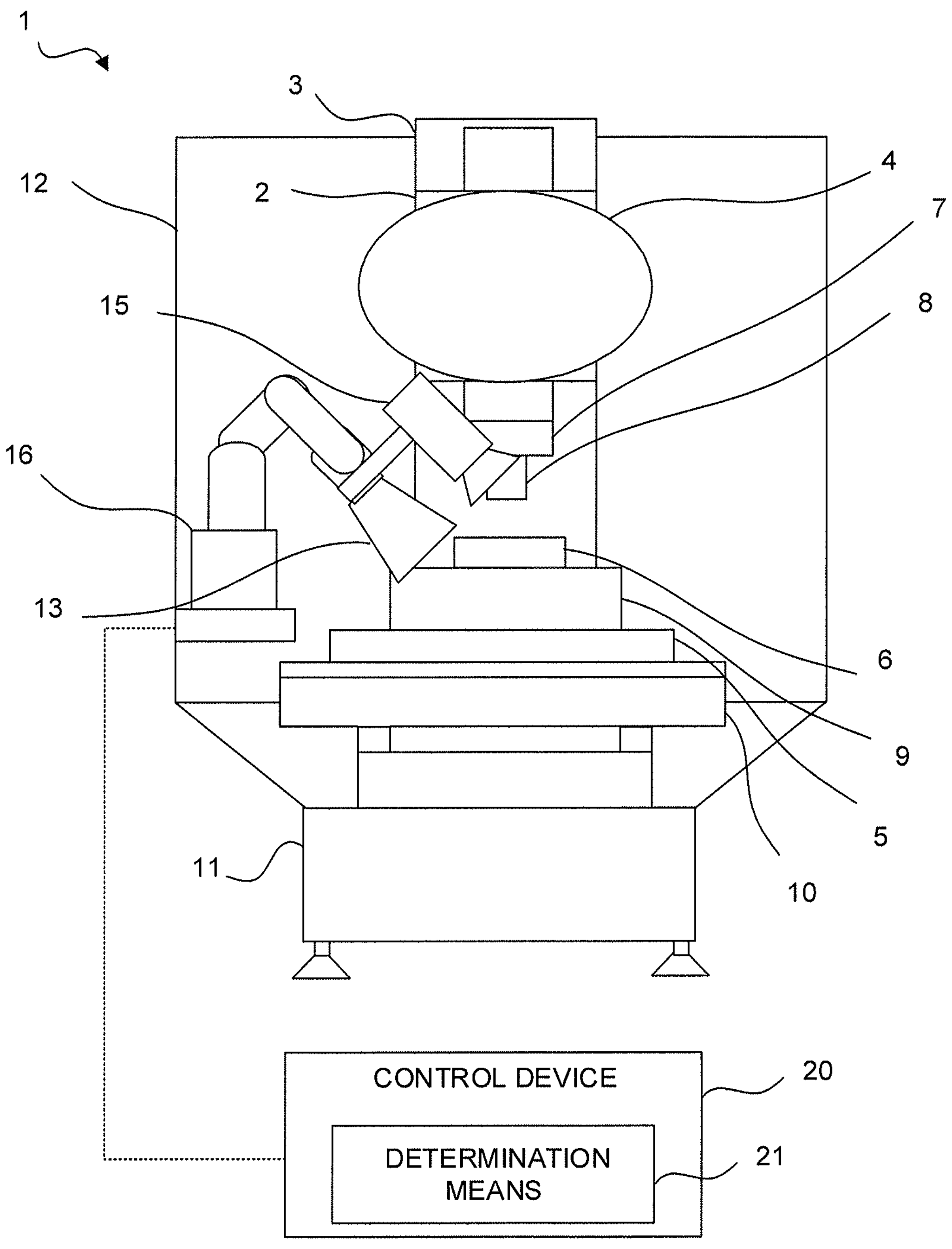
FIG. 7 is a diagram of the processing machine in which the electric discharger and the imaging device are moved by the robot, according to an embodiment of the present invention.
Figure 8:
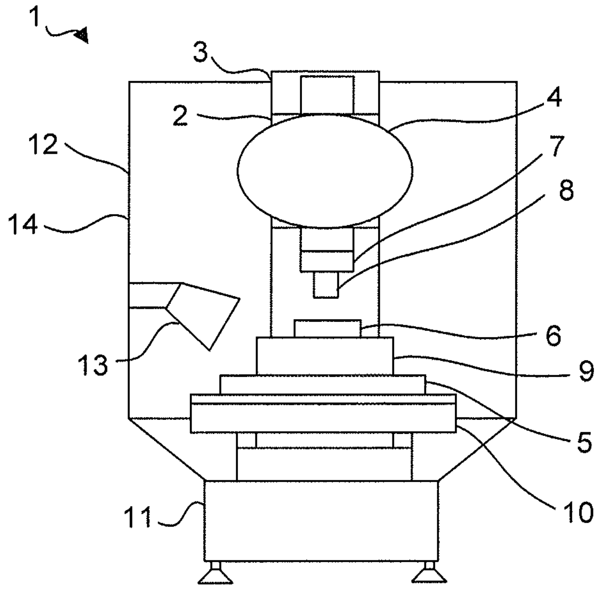
FIG. 8 is a diagram of the processing machine including a conventional electric discharger.
Figure 9:
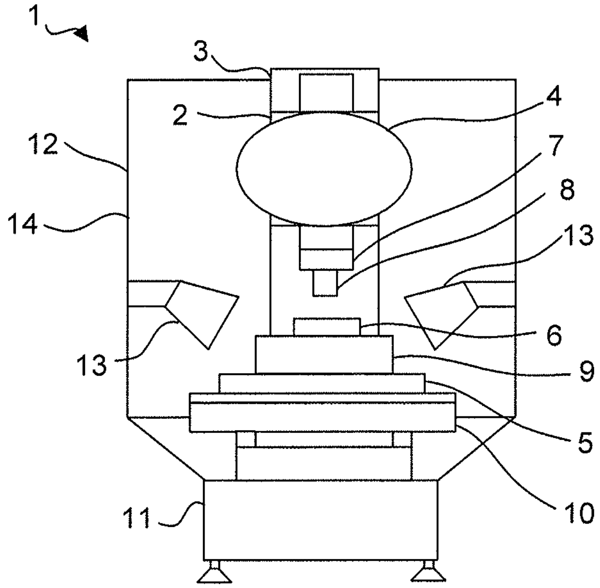
FIG. 9 is a diagram of the processing machine including a plurality of conventional electric dischargers.

As illustrated in FIG. 7, the imaging device 15 may be mounted on the robot 16 together with the electric discharger 13. Further, the electric discharger 13 and the imaging device 15 may respectively be mounted on different robots.

By using the robot 16 as described above, the electric discharger 13 and the imaging device 15 can be moved three-dimensionally without considering the arrangement of the movement means 14.

In the foregoing, an embodiment of the present invention has been described. The embodiment can be carried out in various modes by making appropriate alterations.

For example, although the control device 20 is illustrated to be outside the processing machine 1 in diagrams of the above embodiment, the control device 20 may be contained in the processing machine 1.

The invention claimed is:

1. A processing machine comprising:

an electric discharger to remove static electricity from a charged work piece or charged machining chips;

a movement means that moves the electric discharger;

an imaging device that captures a state of the charged workpiece or the charged machining chips; and a controller configured to:

determine a location needing removal of the static electricity from information captured by the imaging device, control the movement means to move the electric discharger to the location, and control the electric discharger to remove the static electricity, wherein the imaging device is mounted on the movement means.

2. The processing machine according to claim 1, wherein the movement means is a robot.

3. The processing machine according to claim 1, wherein the movement means includes a beam supported by a constituting member of the processing machine providing movement of the electric discharger in at least two dimensions, and a power source provided in the beam.

4. The processing machine according to claim 1, wherein the controller is further configured to control the movement means to move electric discharger to a predetermined retreat position when discharge is complete.

* * * * *